(12) United States Patent
Tabata et al.

(10) Patent No.: US 8,564,188 B2
(45) Date of Patent: Oct. 22, 2013

(54) LUMINESCENT MATERIAL, LUMINESCENT MATERIAL COMPLEX AND METHOD OF MANUFACTURING THE SAME, FLUORESCENT LABELING REAGENT AND METHOD OF MANUFACTURING THE SAME, AND LIGHT EMITTING ELEMENT

(75) Inventors: Seiichiro Tabata, Kanagawa (JP); Shinichiro Yamada, Kanagawa (JP); Tsutomu Noguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 527 days.

(21) Appl. No.: 12/716,833

(22) Filed: Mar. 3, 2010

(65) Prior Publication Data

US 2010/0237768 A1 Sep. 23, 2010

(30) Foreign Application Priority Data

Mar. 17, 2009 (JP) ................................ P2009-064566

(51) Int. Cl.
*H05B 33/14* (2006.01)

(52) U.S. Cl.
USPC ............................. 313/503; 257/98; 257/100

(58) Field of Classification Search
USPC ............... 313/503; 257/79, 98–100; 428/64.4
See application file for complete search history.

(56) References Cited

U.S. PATENT DOCUMENTS

| | | | |
|---|---|---|---|
| 6,531,097 B1 * | 3/2003 | Vojnovic et al. | 422/82.07 |
| 6,600,175 B1 * | 7/2003 | Baretz et al. | 257/100 |
| 2003/0080341 A1 * | 5/2003 | Sakano et al. | 257/79 |
| 2008/0293584 A1 | 11/2008 | Aizawa et al. | |
| 2009/0061141 A1 * | 3/2009 | Morishita et al. | 428/64.4 |

FOREIGN PATENT DOCUMENTS

| | | |
|---|---|---|
| JP | 4289691 | 10/1992 |
| JP | 2007-290873 | 11/2007 |
| JP | 2008-208283 | 9/2008 |
| JP | 2008-273790 | 11/2008 |
| JP | 2009-007536 | 1/2009 |
| WO | 2007/074722 | 7/2007 |
| WO | 2005/021449 | 11/2009 |

OTHER PUBLICATIONS

European Search Report for Appl. No. 10002082.5-2111/2230289 dated Dec. 9, 2010, 6 pages.

Rao A. P., Roa A. V.: "Luminiscent dye Rhodamine 6G doped monolithic and transparent TEOS silica xerogels and spectral properties" Science and Technology of Advanced Materials, vol. 4, No. 2, May 2003, pp. 121-129, XP002609178.

Kalapathy U., Proctor A., Shultz J.: "An improved method for production of silica from rice hull ash" Bioresource Technology, vol. 85, No. 3, Dec. 2002, pp. 285-289, XP002609179.

Japanese Office Action issued Apr. 23, 2013 in corresponding Japanese Patent Application No. 2009-064566.

\* cited by examiner

*Primary Examiner* — Mary Ellen Bowman
(74) *Attorney, Agent, or Firm* — K&L Gates LLP (57) ABSTRACT

A light emitting element, includes: a luminescent material which is obtained from a plant-derived material as a raw material, and which contains therein a silicon oxide containing therein silicon having a content rate of 40 wt. % or more, and oxygen having a content rate of 40 wt. % or more as a principal component; a fluorescent substance adsorbed on a surface of the luminescent material; and an energy source for exciting the luminescent material and the fluorescent substance.

20 Claims, 9 Drawing Sheets

FIG. 4A
CL IMAGE (MEASUREMENT WAVELENGTH: 325 nm)

FIG. 4B
SEM IMAGE

FIG. 4C
CL IMAGE (MEASUREMENT WAVELENGTH: ENTIRE AREA)

FIG. 4D
SFM IMAGE

LUMINESCENT MATERIAL, LUMINESCENT MATERIAL COMPLEX AND METHOD OF MANUFACTURING THE SAME, FLUORESCENT LABELING REAGENT AND METHOD OF MANUFACTURING THE SAME, AND LIGHT EMITTING ELEMENT

CROSS REFERENCES TO RELATED APPLICATIONS

The present application claims priority to that disclosed in Japanese Priority Patent Application JP 2009-064566 filed in the Japan Patent Office on Mar. 17, 2009, the entire content of which is hereby incorporated by reference.

BACKGROUND

The present application relates to a luminescent material, a luminescent material complex using the luminescent material and a method of manufacturing the same, a fluorescent labeling reagent and a method of manufacturing the same, and a light emitting element.

Normally, a white light emitting diode (white LED) is composed of a blue light emitting diode, and a phosphor made of a rare earth element. However, the white LED involves such a problem that a luminance of a green light having a wavelength near 520 nm is low. Under such a background, in recent years, a research, about a luminescence behavior of either silicon or a silicon oxide, aiming for applications to the white LED or the like has been actively carried out. For example, a light emitting element formed from a silica glass containing therein fumed silica as a raw material is well known from PCT Patent Publication No. WO2005/021449. In addition, a light emitting element made from silica fine particles containing therein fumed silica as a raw material, for example, is well known from Japanese Patent Laid-Open No. 2007-290873.

In addition, a labeling reagent using silica nano-particles, for example, is well known from Japanese Patent Laid-Open No. 2008-273790 (hereinafter referred to as Patent Document 1). In this case, a silane coupling agent is added to a reverse micelle disperse system composed of a surfactant in a hydrophobic solvent, water containing therein a basic electrolyte and a hydrophilic organic solvent, the silane coupling agent is hydrolyzed with the water, and a silica monomer is polymerized to form the silica nano-particles.

SUMMARY

In this connection, the light emitting element containing therein the fumed silica as the raw material involves such a problem that a large thermal energy is necessary for making the fumed silica, and thus a large load is applied to the environment. In addition, in the case of the labeling reagent using the silica nano-particles and disclosed in Patent Document 1, the silica nano-particles utilizes the micelle structure formed by the surfactant. Thus, there is encountered such a problem that as was expected, the large thermal energy is necessary for making the labeling reagent, and thus the large load is applied to the environment.

The present embodiment has been made in order to solve the problems described above, and it is therefore desirable to provide a luminescent material in which a large thermal energy is unnecessary for making the luminescent material, and thus a small load is merely applied to the environment, a luminescent material complex using such a luminescent material and a method of manufacturing the same, a fluorescent labeling reagent and a method of manufacturing the same, and a light emitting element.

In order to attain the desire described above, according to an embodiment, there is provided a luminescent material obtained from a plant-derived material as a raw material, and containing therein a silicon oxide containing therein silicon having a content rate of 40 wt. % or more, and oxygen having a content rate of 40 wt. % or more as a principal component.

According to a first embodiment there is provided a luminescent material complex, including:
(A) the luminescent material of the present embodiment described above; and
(B) a fluorescent substance adsorbed on a surface of the luminescent material.

According to a second embodiment there is provided a luminescent material complex, including:
(A) the luminescent material of the present embodiment described above; and
(B) a fluorescent substance with which a surface of the luminescent material is modified.

According to a first embodiment there is provided a fluorescent labeling reagent, including:
(A) the luminescent material of the present embodiment described above; and
(B) a fluorescent substance adsorbed on a surface of the luminescent material;
the fluorescent substance produces luminescence by radiation of an energy beam.

According to a second embodiment there is provided a fluorescent labeling reagent, including:
(A) the luminescent material of the present embodiment described above; and
(B) a fluorescent substance with which a surface of the luminescent material is modified;
the fluorescent substance produces luminescence by radiation of an energy beam.

According to a first embodiment there is provided a light emitting element, including:
(A) the luminescent material of the present embodiment described above;
(B) a fluorescent substance adsorbed on a surface of the luminescent material; and
(C) an energy source for exciting the luminescent material and the fluorescent substance.

According to a second embodiment there is provided a light emitting element, including:
(A) the luminescent material of the present embodiment described above;
(B) a fluorescent substance with which a surface of the luminescent material is modified; and
(C) an energy source for exciting the luminescent material and the fluorescent substance.

According to a third embodiment there is provided a light emitting element, including:
(A) the luminescent material of the present embodiment described above; and
(B) an energy source for exciting the luminescent material.

According to a first embodiment there is provided a method of manufacturing a luminescent material complex, or a method of manufacturing a fluorescent labeling reagent, including the steps of:
(a) firing a plant-derived material in an atmosphere containing therein oxygen molecules, thereby obtaining a luminescent material which contains therein a silicon oxide containing therein silicon having a content rate of 40 wt. % or more, and oxygen having a content rate of 40 wt. % or more as a principal component; and (b) dipping the luminescent material in a liquid solution containing therein a fluorescent substance, thereby adsorbing the fluorescent substance on a surface of the luminescent material.

According to a second embodiment there is provided a method of manufacturing a luminescent material complex, or a method of manufacturing a fluorescent labeling reagent, including the steps of:

(a) firing a plant-derived material in an atmosphere containing therein oxygen molecules, thereby obtaining a luminescent material which contains therein a silicon oxide containing therein silicon having a content rate of 40 wt. % or more, and oxygen having a content rate of 40 wt. % or more as a principal component; and (b) reacting a fluorescent substance contained in a liquid solution, and the luminescent material with each other, thereby modifying a surface of the luminescent material with the fluorescent substance.

As set forth hereinabove, according to the present embodiment, the luminescent material can be obtained by firing the plant-derived material in the atmosphere containing therein the oxygen molecules. Therefore, the large thermal energy is unnecessary during the manufacture of the luminescent material, and thus the load applied to the environment is small. Also, the luminescent material is a material which is worthy of attention in terms of a new technique applied to the biomass. The present embodiment can be applied to not only electronics use application such as the LED or the illumination, but also the medical fluorescent reagent, including the recognition of a specific cell and a gene.

Additional features and advantages are described herein, and will be apparent from the following Detailed Description and the figures.

DETAILED DESCRIPTION

The present application will be described below with reference to the drawings according to an embodiment. It is noted that the description is given in accordance with the following order.

1. An across-the-board description about an embodiment of a luminescent material according to the present application, first and second embodiments of a luminescent material complex and first and second embodiments of a method of manufacturing the same according to the present application, first and second embodiments of a fluorescent labeling reagent and first and second embodiments of a method of manufacturing the same according to the present application, and first to third embodiments of a light emitting element according to the present application.

2. Example Group 1 (an example of the embodiment of the luminescent material according to the present application, examples of the first embodiment of the luminescent material complex and the first embodiment of the method of manufacturing the same according to the present application, and examples of the first embodiment of the fluorescent labeling reagent and the first embodiment of the method of manufacturing the same according to the present application).

3. Example Group 2 (an example of the embodiment of the luminescent material according to the present application, examples of the second embodiment of the luminescent material complex and the second embodiment of the method of manufacturing the same according to the present application, and examples of the second embodiment of the fluorescent labeling reagent and the second embodiment of the method of manufacturing the same according to the present application).

4. Example Group 3 (examples of the first to third embodiments of the light emitting element and others).

1. An across-the-board description about an embodiment of a luminescent material, first and second embodiments of a luminescent material complex and first and second embodiments of a method of manufacturing the same, first and second embodiments of a fluorescent labeling reagent and first and second embodiments of a method of manufacturing the same, and first to third embodiments of a light emitting.

In an embodiment of a luminescent material, first and second embodiments of a luminescent material complex, first and second embodiments of a fluorescent labeling reagent, first to third embodiments of a light emitting elements, first and second embodiments of a method of manufacturing the luminescent material complex, or first and second embodiments of a method of manufacturing the fluorescent labeling reagent (hereinafter referred collectively, simply to as "the present embodiment" in some cases), at least one kind of material selected from the group consisting of a rice hull, a Phragmites, bamboos, an algae such as a diatom, and diatom earth can also be given as a plant-derived material.

In the present embodiment including the preferred forms described above, it is desirable that a value of a specific surface area of the luminescent material obtained in accordance with a nitrogen BET (Brunauer, Emmett, Teller) method is $10 \, m^2/g$ or more, is preferably $20 \, m^2/g$ or more, and is more preferably $50 \, m^2/g$ or more. The value of the specific surface area of the luminescent material obtained in accordance with the nitrogen BET method is set as 10 $m^2/g$ or more, whereby it is possible to increase an amount of fluorescent substance adsorbed on the surface of the luminescent material, and an amount of fluorescent substance modifying the surface of the luminescent material.

In addition, in the first to third embodiments of the light emitting element according to the present embodiment, an energy source is by no means limited. However, it is possible to use the energy source composed of a semiconductor light emitting element, such as a light emitting diode or a semiconductor laser, for emitting either an ultraviolet light or a blue visible light.

Moreover, in the first and second embodiment of the luminescent material complex, the first and second embodiments of the fluorescent labeling reagent, the first and second embodiments of the light emitting element, the first and second embodiments of the method of manufacturing the fluorescent material complex, or the first and second embodiments of the method of manufacturing the fluorescent labeling reagent, the fluorescent substance can be made at least one kind of material selected from the group consisting of: a Rhodamine derivative such as Rhodamine B or Rhodamine 6G; fluorescein and a derivative thereof; coumalin; Texas-red; a green fluorescent protein (GFP); a blue fluorescent protein; a cyan fluorescent protein; and a yellow fluorescent protein. Also, the fluorescent substance penetrates into fine pore portions formed in the luminescent material, and as a result, a high luminescence intensity can be obtained.

Moreover, in the first and second embodiments of the fluorescent labeling reagent, or the first and second embodiments of the method of manufacturing the fluorescent labeling reagent, the luminescent material can be made to have an acceptor group. Or, the luminescent material can be made to have an acceptor group which can be bonded to any one of a desired molecule, a desired protein, or a desired cell. In such cases, although not being limited as the acceptor group, an organic functional group such as a hydroxyl group, a carboxyl group, an amino group, a mercapto group, a thiocyanate group, an epoxyl group, an isocyanate group or a ketone group can be exemplified as the acceptor group. A material having such a functional group can also be formed on a surface layer of the luminescent material through a silane coupling agent or the like. In addition, it is also possible to adopt such a form that the protein is bonded as the acceptor group to a surface of the luminescent material. In this case, an antigen (such as IL-2, IL-4, IL-5, IL-10, TNF-α, IFN-γ, erythropoietin, a hematopoietic stem cell factor, transforming growth stimulators α and β, or a neuron growth stimulator), an immune body (such as immunoglobulin A, immunoglobulin E, immunoglobulin G or immunoglobulin M), or the like, for example, can be given as such a protein. On the other hand, a microcystin class generated by a blue-green algae; a hepatotoxin such as nodularin or cylindrospermopsin; a neurotoxin such as an anatoxin class or a aphantoxin class; or various organic poisons can be given as a molecule to which the acceptor group can be bonded. In addition, a nucleic acid (DNA (Deoxyribonucleic acid), RNA (ribo nucleic acid)), or an immune body (such as immunoglobulin A, immunoglobulin E, immunoglobulin G or immunoglobulin M), for example, can be given as a desired protein to which the acceptor group can be bonded. Also, a desired protein causing an antigen-antibody reaction [such as an antigen (such as IL-2, IL-4, IL-5, IL-10, TNF (Tumor Necrosis Factor)-α, IFN (Interferon)-γ, erythropoietin, a hematopoietic stem cell factor, transforming growth stimulators α and β, or a neuron growth stimulator), an immune body (such as immunoglobulin A, immunoglobulin E, immunoglobulin G or immunoglobulin M), or the like, for example, can be given. Moreover, an epithelial cell, a contractile cell, a blood cell, an immunocyte, a hepatic cell, a fat cell, a neuron, a glia cell, a reproductive cell, a nurse cell, a cell secreting a hormone, a cell about a sensation, or the like can be given as a desired cell to which the acceptor can be bonded.

In the first and second embodiments of the method of manufacturing the luminescent material complex, or the first and second embodiments of the method of manufacturing the fluorescent labeling reagent, a plant-derived material is fired in an atmosphere containing therein oxygen molecules. In this case, specifically, an atmosphere, in which a hydrocarbon component can be removed with oxygen, such as an airly atmosphere, or a highly-concentrated oxygen atmosphere (for example, an atmosphere of 100% oxygen can be given as the atmosphere containing therein oxygen molecules. In addition, a temperature in the range of 500 to 1,000° C. can be exemplified as a firing temperature, and a time in the range of one to five hours can be exemplified as a firing time. It is noted that after completion of the firing, excessive minerals can be removed by carrying out processing using a hydrochloric acid, a nitric acid or the like, thereby refining the luminescent material.

In the first embodiment of the method of the method of manufacturing the luminescent material complex, or the first embodiment of the method of the method of manufacturing the fluorescent labeling reagent, specifically, any solvent can be used as long as the solvent concerned meets a condition that the solvent concerned can dissolve a fluorescent substance at a decomposition temperature or less, and has a viscosity suitable for penetrating into fine pores. A time in the range of six to 12 hours, for example, can be given as a time for which the luminescent material is dipped in the liquid solution containing therein the fluorescent substance.

On the other hand, in the second embodiment of the method of the method of manufacturing the luminescent material complex, or the second embodiment of the method of the method of manufacturing the fluorescent labeling reagent, specifically, any solvent can be used as the liquid solution containing therein the fluorescent material as long as the solvent concerned meets a condition that the solvent concerned can dissolve the fluorescent substance at the decomposition temperature or less, can cause a chemical reaction between a functional group and the fluorescent substance on surfaces of fine pores of the luminescent material to progress, and has a low vapor pressure. Specifically, a condition such that the reaction can be caused in each of the luminescent material and the fluorescent substance at the decomposition temperature or less can be given as the reaction condition caused between the fluorescent substance contained in the liquid solution, and the luminescent material.

A nitrogen BET method is a method in which nitrogen is adsorbed and desorbed as an adsorbed molecule on and from an adsorption agent (the luminescent material in this case), thereby measuring an adsorption isotherm, and measured data is analyzed in accordance with a BET expression expressed by Expression (1). Thus, a specific surface area, a fine pore volume and the like can be calculated in accordance with this nitrogen BET method. Specifically, when a value of the specific surface area is calculated in accordance with this nitrogen BET method, firstly, nitrogen is adsorbed and desorbed as the adsorbed molecule on and from the adsorption agent (the luminescent material), thereby measuring the adsorption isotherm. Also, $[p/\{V_a(p_0-p)\}]$ is calculated from the resulting adsorption isotherm in accordance with either Expression (1) or Expression (1') into which Expression (1) is transformed, and is plotted against an equilibrium relative pressure ($p/p_0$). Also, $[p/\{V_a(p_0-p)\}]$ thus plotted is regarded as being expressed by a straight line, and a gradient, s ($=[(C-1)/(C\cdot V_m)]$), and an intercept, i ($=[1/(C\cdot V_m)]$), are both calculated in accordance with a least-squares method. Also, $V_m$ and C are both calculated from the resulting gradient, s, and intercept, i, in accordance with Expressions (2-1) and (2-2). In addition, the specific surface area, $a_{sBET}$, is calculated from $V_m$ in accordance with Expression (3) (refer to a manual of BELSORP-mini and BELSORP Analyzing Software manufactured by BEL JAPAN, Inc., pp. 62 to 66). It is noted that the nitrogen BET method is a measuring method conforming to JIS R 1626-1996 "A method of measuring a specific surface area based on a gas adsorption BET method for fine ceramics powder."

$$V_a = (V_m \cdot C \cdot p)/[(p_0-p)\{1+(C-1)(p/p_0)\}] \tag{1}$$

where $V_a$ is an adsorption amount, $V_m$ is an adsorption amount in a single molecule layer, p is a pressure in a phase of equilibrium of nitrogen, and $p_o$ is a saturated vapor pressure of nitrogen.

$$[p/\{V_a(p_0-p)\}] = [(C-1)/(C\cdot V_m)](p/p_0) + [1/(C\cdot V_m)] \tag{1'}$$

$$V_m = 1/(s+i) \tag{2-1}$$

$$C = (s/i) + 1 \tag{2-2}$$

$$a_{sBET} = (V_m \cdot L \cdot \sigma)/22414 \tag{3}$$

where L is the Avogadro's number, and $\sigma$ is an adsorption cross section of nitrogen.

When a fine pore volume $V_p$ is calculated in accordance with the nitrogen BET method, for example, linear interpolation is carried out for the adsorption data of the resulting adsorption isotherm, and an adsorption amount V in the relative pressure set based on a fine pore volume calculation relative pressure is obtained. The fine pore volume $V_p$ can be calculated from the resulting adsorption amount V in accordance with Expression (4) (refer to the manual of BELSORP-mini and BELSORP Analyzing Software manufactured by BEL JAPAN, Inc., pp. 62 to 65). It is noted that a fine pore volume obtained based on the nitrogen BET method will be hereinafter, simply referred to as "a fine pore volume" in some cases.

$$V_p = (V/22414) \times (M_g/\rho_g) \tag{4}$$

where V is an adsorption amount at the relative pressure, $M_g$ is a molecular weight of nitrogen, and $\rho_g$ is a density of nitrogen.

A pore diameter of a meso pore, for example, can be calculated in the form of a distribution of pore diameters from a rate of change of a fine pore volume with respect to the pore diameter in accordance with a BJH method. The BJH method is a method which is widely used as a fine pore analyzing method. When the fine pore distribution is analyzed in accordance with the BJH method, firstly, nitrogen is adsorbed and desorbed as the adsorbed molecule on and from the adsorption agent (the luminescent material), thereby measuring the adsorption isotherm. Also, a thickness of an adsorption layer when adsorbed molecules are gradually adsorbed and desorbed from a state in which the fine pore is filled with the adsorbed molecules (for example, nitrogen molecules), and an inner diameter (which is twice as long as a core radius) caused in this phase are obtained in accordance with the resulting adsorption isotherm. Also, a fine pore radius $r_p$ is calculated in accordance with Expression (5), and the fine pore volume is calculated in accordance with Expression (6). Also, a rate, ($dV_p/dr_p$), of change of the fine pore volume is plotted against the fine pore diameter ($2r_p$) based on the fine pore radius and the fine pore volume, thereby obtaining the fine pore distribution curve (refer to the manual of BELSORP-mini and BELSORP Analyzing Software manufactured by BEL JAPAN, Inc., pp. 85 to 88).

$$r_p = t + r_k \tag{5}$$

where $r_p$ is the fine pore radius, and $r_k$ is a core radius $\{(\text{inner diameter})/2\}$ when the adsorption layer having a thickness, t, is adsorbed on the inner wall of the fine pore having the fine pore radius $r_k$ at a pressure concerned.

$$V_{pn} = R_n \cdot dV_n - R_n \cdot dt_n \cdot c \cdot \Sigma A_{pj} \tag{6}$$

where $V_{pn}$ is the fine pore volume when the n-th round of adsorption and desorption of nitrogen is caused, $dV_n$ is a change amount at that time, $dt_n$ is a change amount of thickness, $t_n$, of the adsorption layer when the n-th round of adsorption and desorption of nitrogen is caused, c is a fixed value, and $\Sigma A_{pj}$ represents an integrated value of areas of wall surfaces of the fine pores from j=1 to j=n−1.

Here, $R_n$ is expressed as follows:

$$R_n = r_{pn}^2/(r_{kn-1} + dt_n)^2 \tag{7}$$

where $r_{kn}$ is the core radius at that time, and $r_{pn}$ is the fine pore radius when the n-th round of adsorption and desorption of nitrogen is caused.

The pore diameter of the micro-fine pore, for example, can be calculated in the form of the distribution of the fine pores from the rate of change of the fine pore volume with respect to the pore diameter in accordance with the MP method. When the distribution of the fine pore is analyzed in accordance with the MP method, firstly, nitrogen is adsorbed on the adsorption agent (luminescent material), thereby obtaining the adsorption isotherm. Also, the resulting adsorption isotherm is converted into the fine pore volume with respect to the thickness, t, of the adsorption layer (plotted against the thickness, t, of the adsorption layer). Also, the fine pore distribution curve can be obtained in accordance with a curvature (a change amount of fine pore volume with respect to a change amount of thickness, t, of the adsorption layer) obtained through the plotting (refer to the manual of BELSORP-mini and BELSORP Analyzing Software manufactured by BEL JAPAN, Inc., pp. 72 to 73, and p. 82).

Example Group 1

Example Group 1 relates to an example of the embodiment of the luminescent material, examples of the first embodiment of the luminescent material complex and the first embodiment of the method of manufacturing the same, and examples of the first embodiment of the fluorescent labeling reagent and the first embodiment of the method of manufacturing the same.

Either in Example Group 1 or in Example Groups 2 and 3 which will be described later, a rice hull (Isehikari produced in Kihokucho, KAGOSIMA Prefecture) was used as the plant-derived material). Also, firstly, this plant-derived material was fired in the atmosphere containing therein oxygen molecules. Specifically, this plant-derived material was placed in a 500-ml conical beaker, and was fired at 500° C. for five hours in an atmosphere open system by using a quartz mantle heater to be ashed. The resulting powdered luminescent material, as shown in TABLE 1, was a luminescent material which was obtained from the plant-derived material as a raw material, and contained therein a silicon oxide containing therein silicon having a content rate of 40 wt. % or more, and oxygen having a content rate of 40 wt. % or more as a principal component. It is noted that quantities of elements were determined in accordance with an energy dispersion method (EDS) by using an energy dispersive X-ray analyzer (JED-2200F manufactured by JEOL Ltd.) as a measurement apparatus for element analysis. Also, the content rates were calculated in the form of ratios by weight (wt. %). A scanning voltage of 15 kV, and a radiation current of 13 μA were set as measurement conditions.

TABLE 1

| element | mass % | the number of atoms % |
|---|---|---|
| C | <0.01 | <0.01 |
| N | <0.01 | <0.01 |
| O | 45.67 | 60.68 |
| F | <0.01 | <0.01 |
| Na | <0.01 | <0.01 |
| Mg | <0.01 | <0.01 |
| Al | <0.01 | <0.01 |
| Si | 48.14 | 36.43 |
| P | 0.4 | 0.28 |
| S | 0.2 | 0.13 |
| Cl | 0.05 | 0.03 |
| K | 2.55 | 1.39 |
| Ca | 0.37 | 0.2 |
| Sc | 0.01 | 0.01 |
| Ti | <0.01 | <0.01 |
| V | <0.01 | <0.01 |
| Cr | <0.01 | <0.01 |
| Mn | <0.01 | <0.01 |
| Fe | <0.01 | <0.01 |
| Co | 0.14 | 0.05 |
| Ni | 0.13 | 0.05 |
| Cu | 1.1 | 0.37 |
| Zn | 0.82 | 0.27 |

Figure 1A:
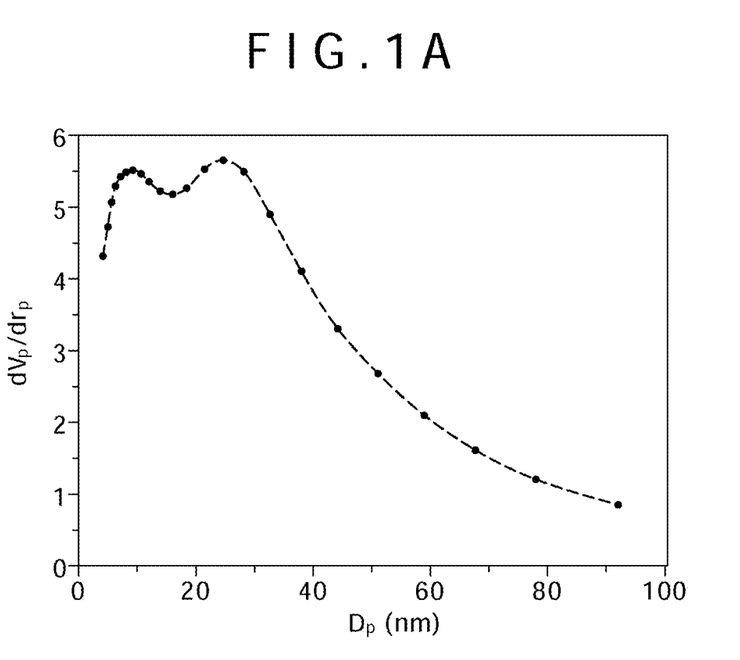
FIGS. 1A and 1B are respectively a graph showing the result of checking a fine pore diameter distribution in a luminescent material obtained in Example Group 1 in accordance with a BJH (Barrett-Joyner-Halenda) method, and a graph showing the result of checking a fine pore diameter distribution in the luminescent material obtained in Example Group 1 in accordance with an MP (Molecular Probe) method.
Figure 1B:
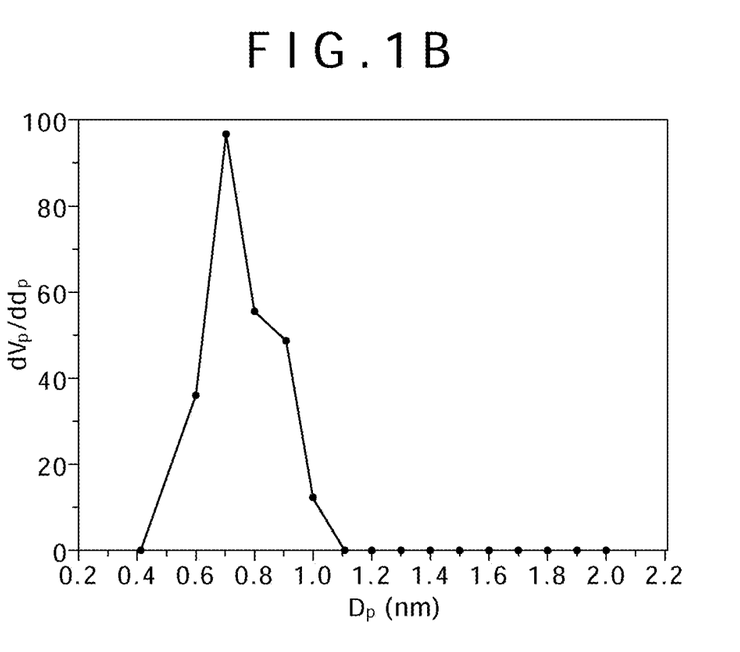

The value of the specific surface area of the luminescent material obtained in accordance with the nitrogen BET method was 80 m2/g. As the result of checking the fine pore diameter distribution in accordance with the BJH method, it was found out that as shown in FIG. 1A, the fine pore diameter distribution has peaks at 10 nm and 30 nm. In addition, as the result of checking the fine pore diameter distribution in accordance with the MP method, it was found out that as shown in FIG. 1B, the fine pore diameter distribution has a peak at 0.7 nm.

Figure 2:
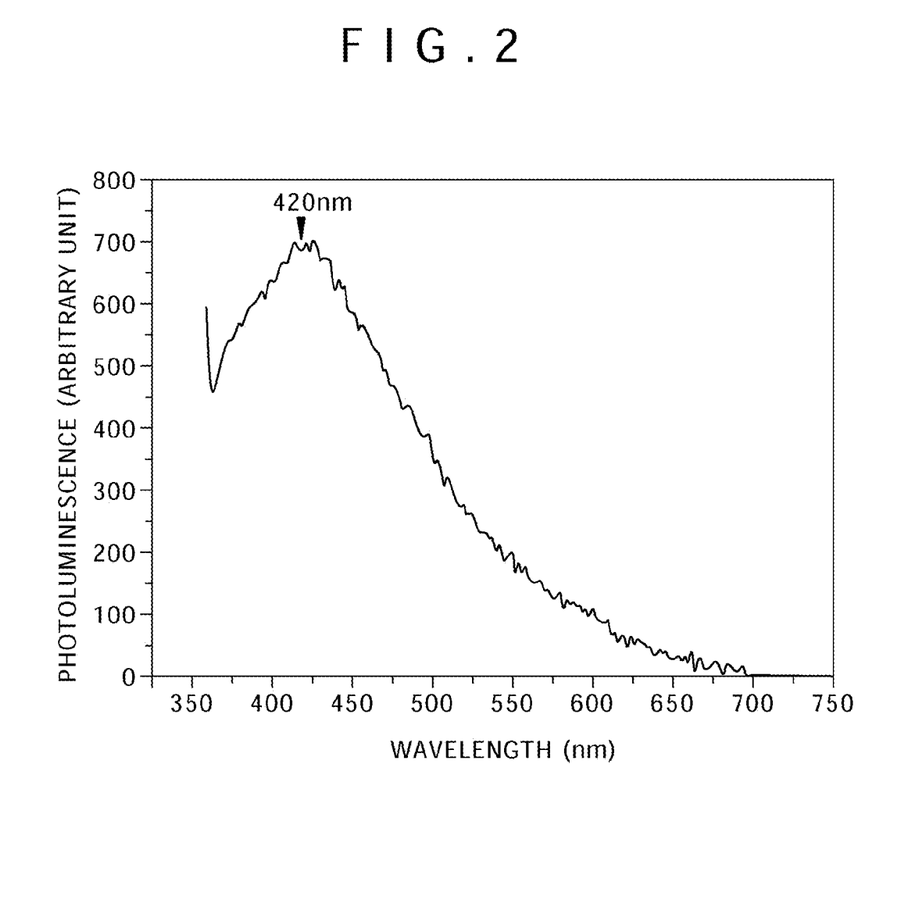
FIG. 2 is a graph showing the result of radiating a laser beam (wavelength: 325 nm) from a HeCd laser to the luminescent material obtained in Example Group 1, and measuring photoluminescence (PL) of the luminescent material.
Figure 3:
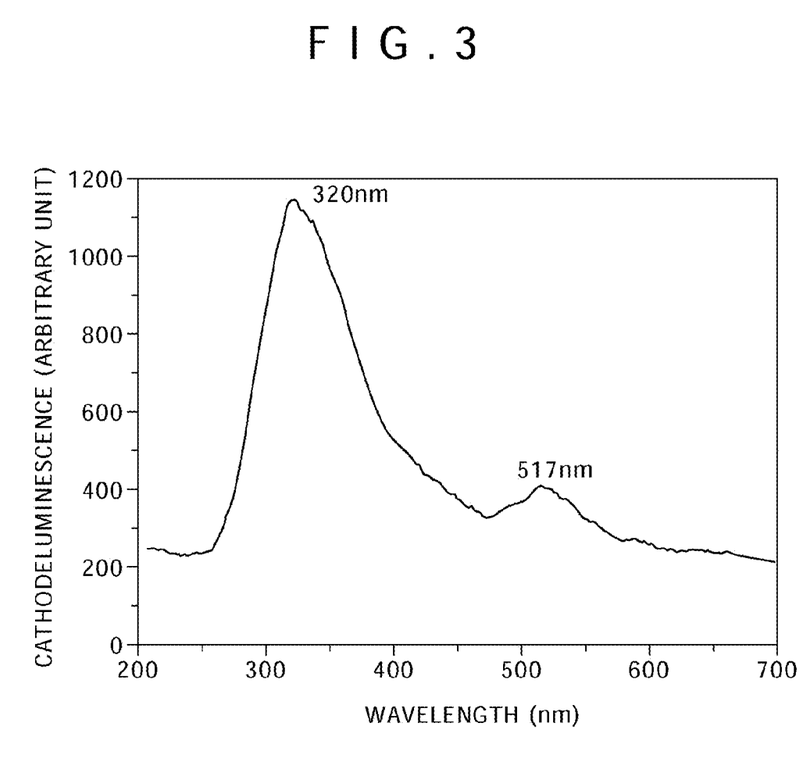
FIG. 3 is a graph showing a spectrum of cathode-luminescence of the luminescent material obtained in Example Group 1.
Figure 4A:
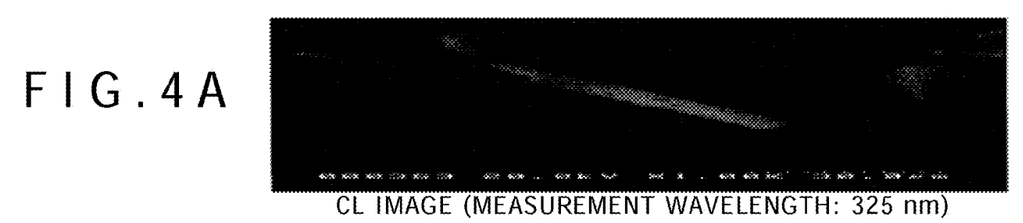
FIGS. 4A and 4C are respectively cathode-luminescence images of the luminescent material obtained in Example Group 1.
Figure 4B:
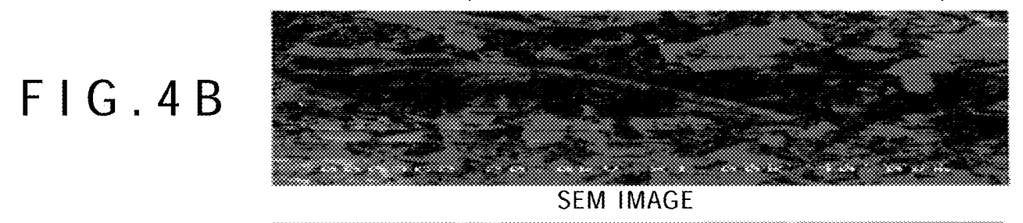
FIGS. 4B and 4D are respectively images of the luminescent material in Example Group 1 each obtained through observation by using a scanning electron microscope.
Figure 4C:
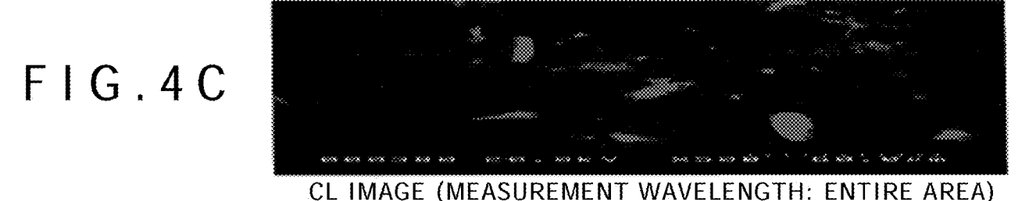
Figure 4D:
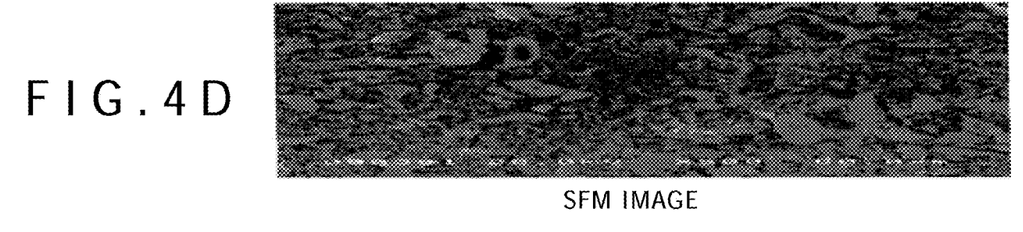

A laser beam (having a wavelength of 325 nm) was radiated from a HeCd laser to the luminescent material obtained in the manner described above, thereby measuring photoluminescence (PL) of the luminescent material. The measurement result is shown in FIG. 2. It was found out that the luminescent material produces luminescence at a wavelength of 420 nm. It is noted that in FIG. 2, an axis of ordinate represents a photoluminescence intensity (unit: arbitrary), and an axis of abscissa represents a luminescent wavelength (unit: nm). In addition, an electron beam was radiated to the luminescent material obtained in the manner described above to measure a spectrum of a cathode-luminescence (CL), thereby obtaining a cathode-luminescence image. At the same time, the observation was carried out for the luminescent material obtained in the manner described above by using a scanning electron microscope (SEM). FIG. 3 shows a spectrum of the cathode-luminescence. It is noted that in FIG. 3, an axis of ordinate represents a cathode-luminescence intensity (unit: arbitrary), and an axis of abscissa represents a luminescence wavelength (unit: nm). In addition, FIGS. 4A and 4C show cathode-luminescence images, respectively, and FIGS. 4B and 4D show SEM images, respectively. In this case, in FIGS. 4A to 4D, the luminescence image and the SEM image shown in FIGS. 4A and 4B, respectively, are obtained from the same field of view, and the luminescence image and the SEM image shown in FIGS. 4C and 4D, respectively, are obtained from the same field of view.

In addition, the luminescent material obtained in the manner described above was dipped in a liquid solution containing therein the fluorescent substance, thereby adsorbing the fluorescent material on the surface of the luminescent material. Specifically, 0.15 g of the luminescent material was dipped in 0.1 mol/l of Rhodamine 6G/10 ml of an ethanol solution through the night. After completion of the physical adsorption of one kind of fluorescent substance on the surface of the luminescent material, the cleaning was sufficiently carried out by using methanol and toluene. Finally, the resulting luminescent material complex was dried in vacuum at 40° C.

Figure 5:
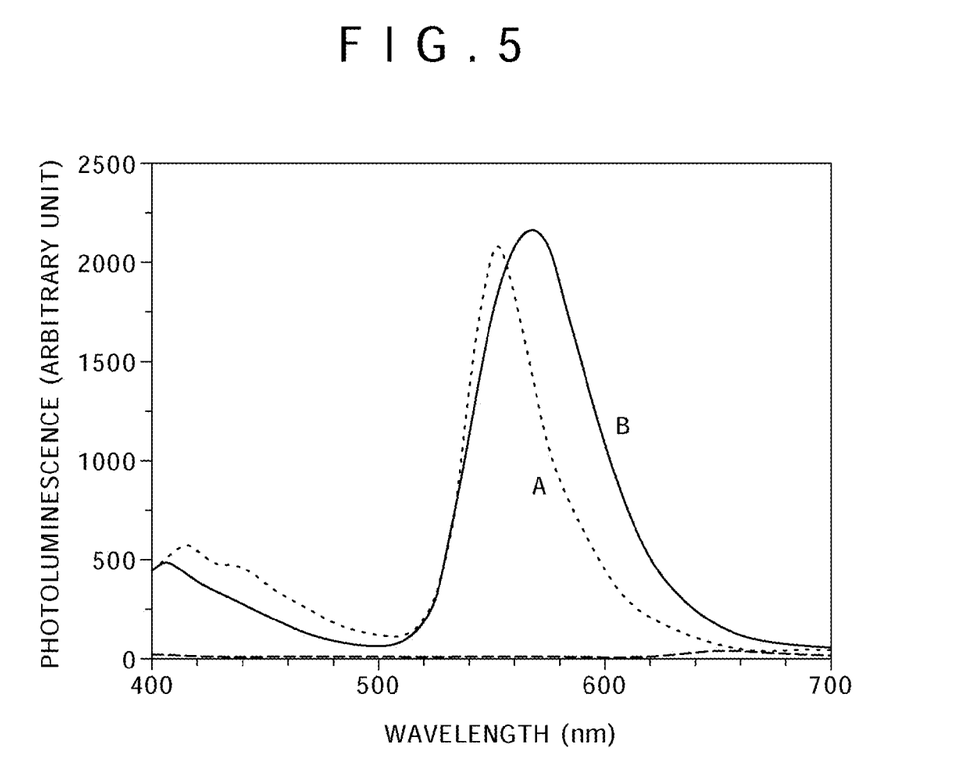
FIG. 5 is a graph showing the results of measuring fluorescence spectra of luminescent material complexes obtained in Example Group 1 and Example Group 2, respectively, and Rhodamine 6G.
Figure 7A:
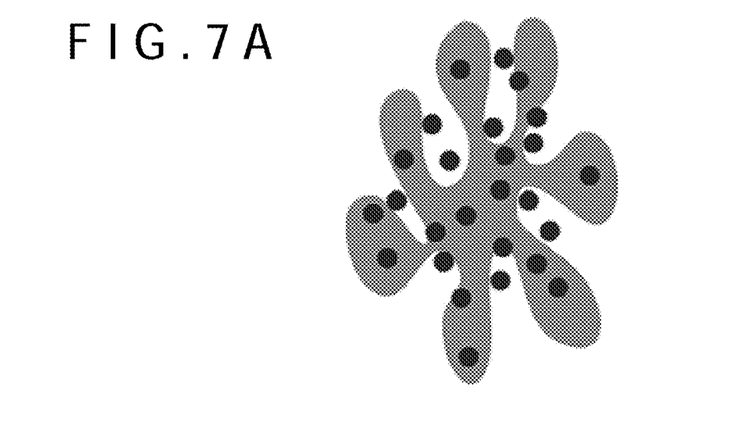
FIGS. 7A and 7B are respectively schematic conceptual diagrams of the luminescent material complexes obtained in Example Group 1 and Example Group 2, respectively.

The luminescent material complex or the fluorescent labeling reagent of Example Group 1 obtained in the manner described above is composed of:

(A) the luminescent material which is obtained from the plant-derived material as the raw material, and contains therein the silicon oxide containing therein silicon having the content rate of 40 wt. % or more, and oxygen having the content rate of 40 wt. % or more as the principal component; and (B) the fluorescent substance (specifically, Rhodamine 6G) adsorbed on the surface of the luminescent material. FIG. 5 shows the result of measuring a fluorescence emission spectrum of the luminescent material complex (fluorescent labeling reagent) of Example Group 1 when an ultraviolet light having a wavelength of 370 nm is radiated (refer to a curve "A"). Also, FIG. 5 shows the result of measuring a fluorescence emission spectrum of Rhodamine 6G of Example Group 1 when the ultraviolet light having the wavelength of 370 nm is radiated (refer to a curve "C"). It is noted that in FIG. 5, an axis of ordinate represents a photoluminescence intensity (unit: arbitrary), and an axis of abscissa represents a luminescence wavelength (unit: nm). It is understood from the curve "C" of FIG. 5 that even when the ultraviolet light having the wavelength of 370 nm is radiated to Rhodamine 6G, Rhodamine 6G produces no luminescence. In addition, FIG. 7A shows a conceptual diagram of the luminescent material complex of Example Group 1. It is noted that in FIG. 7A, the luminescent material is shown in the form of a gray infinite form, and each of the fluorescent substances is shown in the form of a black circle.

Moreover, in Example Group 1, processing in which the surface of the luminescent material is modified with dimethoxyphenyl silane, and the luminescent material is then immersed in an atmosphere of a fuming sulfuric acid was carried out for the fluorescent labeling reagent of Example Group 1 obtained in the manner described above. As a result, there was obtained the fluorescent labeling reagent having a form in which the luminescent material has the acceptor group (specifically, a sulfone group). Specifically, sulfonyl phenyl silane as a probe molecule is chemically bonded to the surface of the luminescent material. Here, in the fluorescent labeling reagent of Example Group 1, the fluorescent material (specifically, Rhodamine 6G) produces luminescence by radiation of an energy beam (an energy beam for measurement, for example, an ultraviolet light having a wavelength of 370 nm) from the outside. Also, such an acceptor group is added to the luminescent material, whereby the fluorescent labeling reagent can be bonded to proteins on the surfaces of cells (hereinafter referred to as "a substance A").

That is to say, a liquid is filtered which is obtained by mixing the fluorescent labeling reagent having a predetermined mass, and the substance A having a predetermined mass with each other, thereby removing the substance A not yet bonded to the fluorescent labeling reagent. After that, a luminescence amount when the ultraviolet light having the wavelength described above is radiated to the mixture as the residue after the filtering is checked in advance. Thus, a relationship between the mass of the substance A, and the luminescence amount is produced in the form of a calibration curve. As a result, the liquid is filtered which is obtained by mixing the fluorescent labeling reagent having the predetermined mass, and the substance A having the predetermined mass with each other, thereby removing the substance A not yet bonded to the fluorescent labeling reagent. After that, the luminescence amount when the ultraviolet light having the wavelength described above is radiated to the mixture as the residue after the filtering is checked in advance, thereby making it possible to obtain the mass (content rate) of the substance A. Or, it is possible to qualitatively confirm the presence of the substance A.

Example Group 2

Example Group 2 relates to an example of the embodiment of the luminescent material, examples of the second embodiment of the luminescent material complex and the second embodiment of the method of manufacturing the same, and examples of the second embodiment of the fluorescent labeling reagent and the second embodiment of the method of manufacturing the same.

Figure 6:
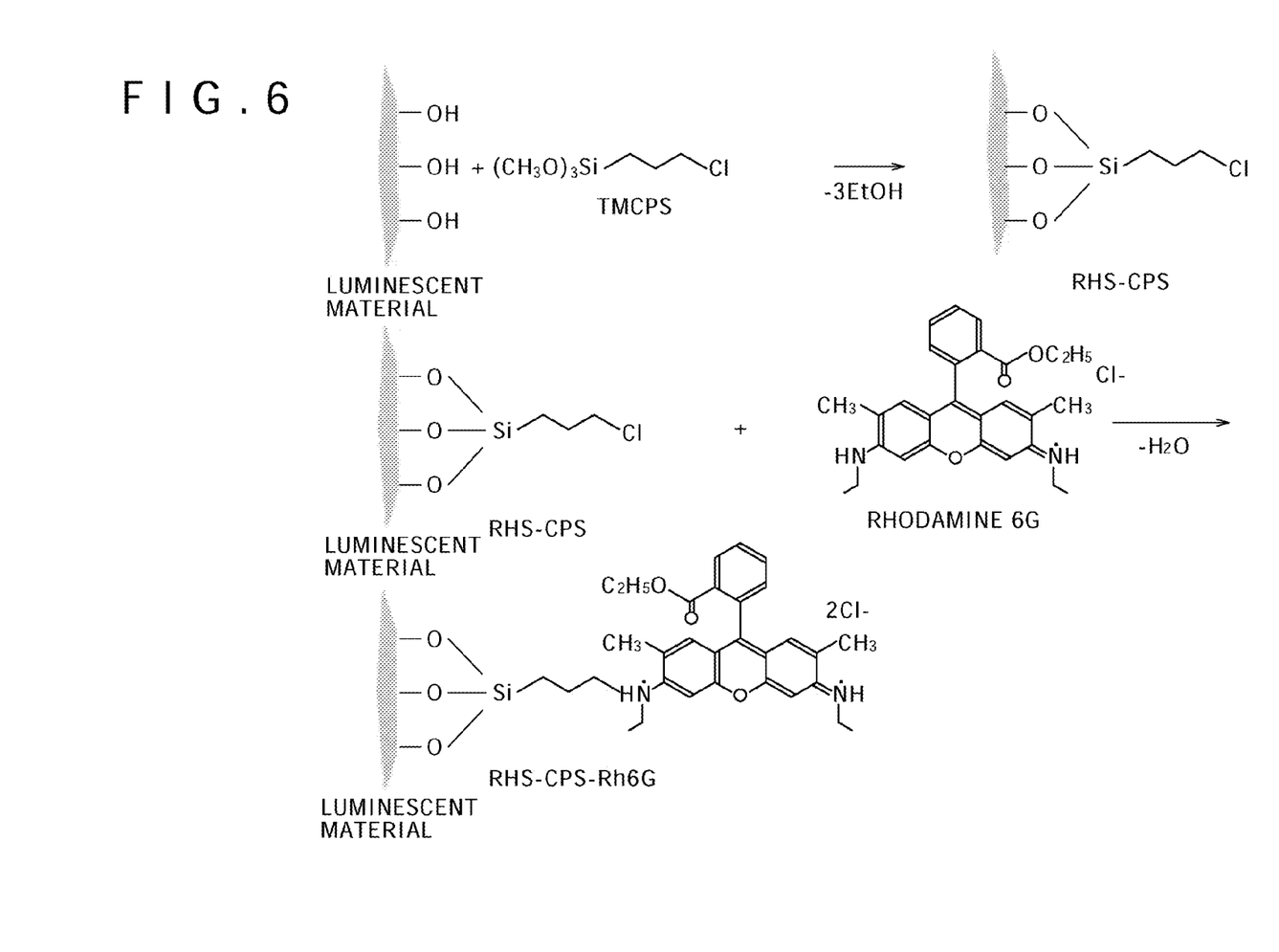
FIG. 6 is a schematic diagram showing a scheme in which the fluorescent substance contained in a liquid solution, and the luminescent material are caused to react with each other in Example Group 2, thereby modifying a surface of the luminescent material with the fluorescent substance.

In Example Group 2, firstly, the same luminescent material as that in Example Group 1 was obtained in accordance with the same method as that in Example Group 1. Also, after that, the fluorescent substance contained in the liquid solution, and the luminescent material were caused to react with each other, thereby chemically modifying the surface of the luminescent material with the fluorescent substance. Specifically, 1 g of the luminescent material, and 2.8 g of trimethoxychloropropyl silane (TMCPS) were refluxed in an oil bath having 20 ml of toluene put therein at 130° C. for 10 hours. A rotating speed of a stirrer was set at 300 rpm. After that, the solvent was filtered, and the reduced-pressure drying was carried out at 50° C. Next, 0.5 g of the resulting RHS-CPS (the substance in which the surface of the rice hull was modified with chloropropyl silane, and 20.26 mg of Rhodamine 6G (Rh 6G) were refluxed in a liquid solution of toluene:ethanol=1:1 for eight hours. After completion of the reaction, the resulting luminescent material complex was sufficiently cleaned by using methanol and toluene. Finally, the resulting luminescent material complex was dried in vacuum at 40° C. FIG. 6 shows a scheme as has been described.

Figure 7B:
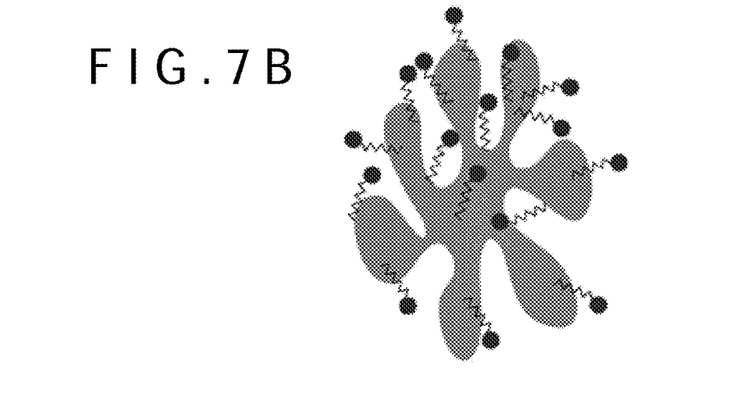

The luminescent material complex or the fluorescent labeling reagent of Example Group 2 obtained in the manner described above is composed of:

(A) the luminescent material which is obtained from the plant-derived material as the raw material, and which contains therein the silicon oxide containing therein silicon having the content rate of 40 wt. % or more, and oxygen having the content rate of 40 wt. % or more as the principal component; and (B) the fluorescent substance (specifically, Rhodamine 6G) with which the surface of the luminescent material is modified. FIG. 5 shows the result of measuring a fluorescence emission spectrum of the luminescent material complex (fluorescent labeling reagent) of Example Group 2 when the ultraviolet light having the wavelength of 370 nm is radiated (refer to a curve "B"). In addition, FIG. 7B shows a conceptual diagram of the luminescent material complex of Example Group 2. It is noted that in FIG. 7B, the luminescent material is shown in the form of the gray infinite form, each of the fluorescent substances is shown in the form of the black circle, and chloropropyl silane is shown in the form of a polygonal line.

Figure 8:
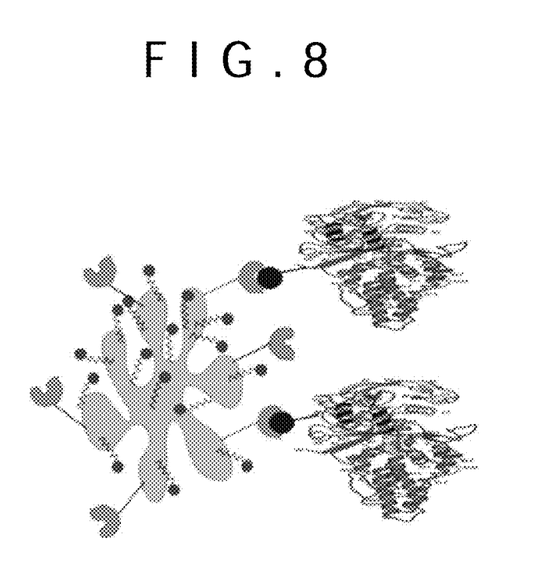
FIG. 8 is a schematic conceptual diagram showing a state in which an acceptor group of a fluorescent labeling reagent in Example Group 2 is bonded to any one of a desired molecule, a desired protein or a desired cell.

Moreover, the same processing as that in Example Group 1 was carried out for the fluorescent labeling reagent of Example Group 2 obtained in the manner described above, whereby the fluorescent labeling reagent of Example Group 2 having a form in which the luminescent material has the acceptor group was obtained similarly to the case of Example Group 1. The fluorescent labeling reagent of Example Group 2 is also used in accordance with the same method as that in Example Group 1, thereby making it possible to measure the mass (content rate) of the substance A. Note that, FIG. 8 is a conceptual diagram showing a state in which the acceptor group of the fluorescent labeling reagent of Example Group 2 is bonded to the substance A. As shown in FIG. 8, a double-crossing shape and a line segment extending therefrom schematically represent the molecule having the acceptor group.

Example Group 3

Example Group 3 relates to examples of the first to third embodiments of the light emitting element.

In Example Group 3, the light emitting element is composed of the luminescent material obtained in Example Group 1 and the fluorescent substance adsorbed on the surface of the luminescent material (they are substantially the luminescent material complex obtained in Example Group 1), and the energy source. Specifically, the energy source is a light emitting diode for emitting a light having a wavelength of either 560 nm or 570 nm, and serves to excite the luminescent material and the fluorescent substance. Or, the light emitting element is composed of the luminescent material obtained in Example Group 1 and the fluorescent substance modifying the surface of the luminescent material (they are substantially the luminescent material complex obtained in Example Group 2), and the energy source for exciting the luminescent material and the fluorescent substance. Or, the light emitting element is composed of the luminescent material obtained in Example Group 1, and the energy source for exciting the luminescent material.

Figure 9:
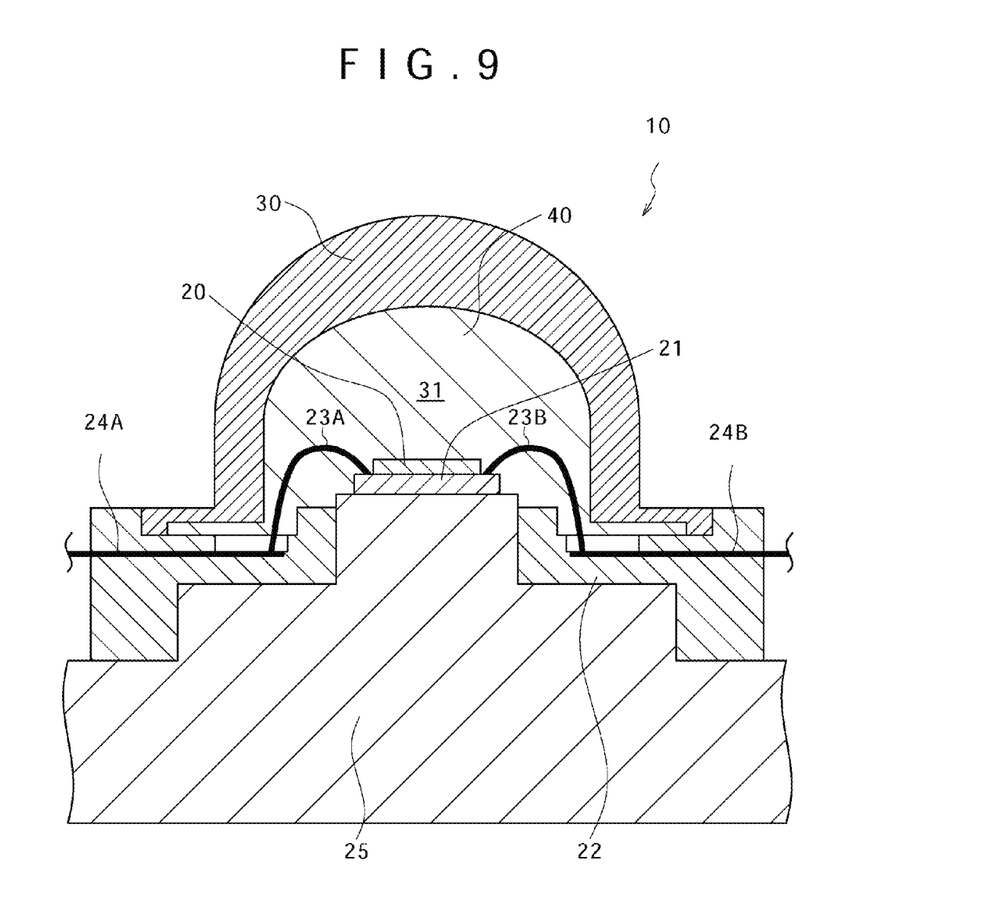
FIG. 9 is a schematic cross sectional view of a light emitting element according to Example Group 3.

FIG. 9 shows a schematic cross sectional view of the light emitting element of Example Group 3. The light emitting element 10 is composed of a light emitting diode 20, and a cap 30 made of a plastic. In this case, the light emitting diode 20 is fixed to a supporting body and serves as an energy source. Specifically, a light emission portion of the light emitting diode 20 is covered with the cap 30. The cap 30 covers the light emitting diode 20 through a space 31. In addition, specifically, the light emitting diode 20 is fixed to a sub-mount 21, and the light emitting diode 20 is electrically connected to external electrodes 24A and 24B through wirings (not shown), and gold wires 23A and 23B which are all provided in the sub-mount 21. Each of the external electrodes 24A and 24B are electrically connected to a drive circuit (not shown in FIG. 9). The sub-mount 21 is mounted to a heatsink 25 through an adhesive agent. The heatsink 25 is adhered to a supporting member 22 through an adhesive agent. The supporting member 22 is made of a PMMA resin, and is formed in an injection forming process. A space 31 defined between the cap 30 and the light emitting element 10 is filled with any one of the luminescent material obtained in Example Group 1, the luminescent material complex obtained in Example Group 1, or the luminescent material complex 40 obtained in Example Group 2. The cap 30 is made of an acrylic resin, and is formed in an injection forming process. The space 31 is filled with such a luminescent material or luminescent material complex 40, whereby the light emitted from the light emitting diode 20 excites the luminescent material or luminescent material complex 40, so that a light (specifically, a white light) from the luminescent material or luminescent material complex 40 is emitted to the outside through the cap 30.

Although the present application has been described so far based on the embodiments and the examples thereof, the present application is by no means limited thereto, and thus various changes thereof can be made. Although in the embodiments and the examples thereof, the description has been given with respect to the case where the rice hull is used as the plant-derived material, in addition thereto, any of the Phragmites, the Bamboos, the algae such as the diatom, or the diatom earth can be used as the plant-derived material, any one of them may be simply used, or a plurality kind of them may be used in a mixed style. In addition, the structure and constitution of the light emitting element are by no means limited those shown in FIG. 9. For example, a structure and a constitution may also be adopted such that the luminescent material or luminescent material complex is made in the form of a bulk, and the light is radiated from the light emitting diode as the energy source to the luminescent material or luminescent material complex having such a form.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A light emitting element, comprising:
    a luminescent material which is obtained from a plant-derived material as a raw material, and which contains therein a silicon oxide containing therein silicon having a content rate of 40 wt. % or more, and oxygen having a content rate of 40 wt. % or more as a principal component;
    a fluorescent substance adsorbed on a surface of said luminescent material; and
    an energy source for exciting said luminescent material and said fluorescent substance.

2. The light emitting element according to claim 1, wherein said plant-derived material is at least one kind of material selected from the group consisting of a rice hull, a Phragmites, Bamboos, an algae such as a diatom, and diatom earth.

3. The light emitting element according to claim 1, wherein a value of a specific surface area of said luminescent material obtained in accordance with a Brunauer, Emmett, Teller method is equal to or larger than 10 $m^2/g$.

4. The light emitting element according to claim 1, wherein said energy source is composed of a light emitting diode for emitting either an ultraviolet light or a blue visible light.

5. The light emitting element according to claim 1, wherein said fluorescent substance is at least one kind of material selected from the group consisting of a Rhodamine derivative, fluorescein and a derivative thereof, coumalin, Texas-red, a green fluorescent protein, a blue fluorescent protein, a cyan fluorescent protein, and a yellow fluorescent protein.

6. A light emitting element, comprising:
    a luminescent material which is obtained from a plant-derived material as a raw material, and which contains therein a silicon oxide containing therein silicon having a content rate of 40 wt. % or more, and oxygen having a content rate of 40 wt. % or more as a principal component;
    a fluorescent substance with which a surface of said luminescent material is modified; and
    an energy source for exciting said luminescent material and said fluorescent substance.

7. A light emitting element, comprising:
    a luminescent material which is obtained from a plant-derived material as a raw material, and which contains therein a silicon oxide containing therein silicon having a content rate of 40 wt. % or more, and oxygen having a content rate of 40 wt. % or more as a principal component; and
    an energy source for exciting said luminescent material.

8. A luminescent material complex, comprising:
    a luminescent material which is obtained from a plant-derived material as a raw material, and which contains therein a silicon oxide containing therein silicon having a content rate of 40 wt. % or more, and oxygen having a content rate of 40 wt. % or more as a principal component; and
    a fluorescent substance adsorbed on a surface of said luminescent material.

9. A luminescent material complex, comprising:
    a luminescent material which is obtained from a plant-derived material as a raw material, and which contains therein a silicon oxide containing therein silicon having a content rate of 40 wt. % or more, and oxygen having a content rate of 40 wt. % or more as a principal component; and
    a fluorescent substance with which a surface of said luminescent material is modified.

10. A luminescent material obtained from a plant-derived material as a raw material, and containing therein a silicon oxide containing therein silicon having a content rate of 40 wt. % or more, and oxygen having a content rate of 40 wt. % or more as a principal component.

11. A fluorescent labeling reagent, comprising:
    a luminescent material which is obtained from a plant-derived material as a raw material, and which contains therein a silicon oxide containing therein silicon having a content rate of 40 wt. % or more, and oxygen having a content rate of 40 wt. % or more as a principal component; and
    a fluorescent substance adsorbed on a surface of said luminescent material;
    wherein said fluorescent substance produces luminescence by radiation of an energy beam.

12. The fluorescent labeling reagent according to claim 11, wherein said plant-derived material is at least one kind of material selected from the group consisting of a rice hull, a Phragmites, Bamboos, an algae such as a diatom, and diatom earth.

13. The fluorescent labeling reagent according to claim 11, wherein a value of a specific surface area of said luminescent material obtained in accordance with a Brunauer, Emmett, Teller method is equal to or larger than 10 m2/g.

14. The fluorescent labeling reagent according to claim 11, wherein said fluorescent material has an acceptor group.

15. The fluorescent labeling reagent according to claim 11, wherein said fluorescent material has an acceptor group which is adapted to be bonded to any one of a desired molecule, a desired protein or a desired cell.

16. A fluorescent labeling reagent, comprising:
    a luminescent material which is obtained from a plant-derived material as a raw material, and which contains therein a silicon oxide containing therein silicon having a content rate of 40 wt. % or more, and oxygen having a content rate of 40 wt. % or more as a principal component; and a fluorescent substance with which a surface of said luminescent material is modified;

wherein said fluorescent substance produces luminescence by radiation of an energy beam.

17. A method of manufacturing a luminescent material complex, comprising:

firing a plant-derived material in an atmosphere containing therein oxygen molecules, thereby obtaining a luminescent material which contains therein a silicon oxide containing therein silicon having a content rate of 40 wt. % or more, and oxygen having a content rate of 40 wt. % or more as a principal component; and dipping said luminescent material in a liquid solution containing therein a fluorescent substance, thereby adsorbing said fluorescent substance on a surface of said luminescent material.

18. A method of manufacturing a luminescent material complex, comprising:

firing a plant-derived material in an atmosphere containing therein oxygen molecules, thereby obtaining a luminescent material which contains therein a silicon oxide containing therein silicon having a content rate of 40 wt. % or more, and oxygen having a content rate of 40 wt. % or more as a principal component; and reacting a fluorescent substance contained in a liquid solution, and said luminescent material with each other, thereby modifying a surface of said luminescent material with said fluorescent substance.

19. A method of manufacturing a fluorescent labeling reagent, comprising:

firing a plant-derived material in an atmosphere containing therein oxygen molecules, thereby obtaining a luminescent material which contains therein a silicon oxide containing therein silicon having a content rate of 40 wt. % or more, and oxygen having a content rate of 40 wt. % or more as a principal component; and dipping said luminescent material in a liquid solution containing therein a fluorescent substance, thereby adsorbing said fluorescent substance on a surface of said luminescent material.

20. A method of manufacturing a luminescent material complex, comprising:

firing a plant-derived material in an atmosphere containing therein oxygen molecules, thereby obtaining a luminescent material which contains therein a silicon oxide containing therein silicon having a content rate of 40 wt. % or more, and oxygen having a content rate of 40 wt. % or more as a principal component; and reacting a fluorescent substance contained in a liquid solution, and said luminescent material with each other, thereby modifying a surface of said luminescent material with said fluorescent substance.

* * * * *